United States Patent
Cuzin et al.

(10) Patent No.: US 6,320,367 B1
(45) Date of Patent: Nov. 20, 2001

(54) DEVICE FOR ANALYZING A SINGLE PULSE WITH VARIABLE STEP

(75) Inventors: Marc Cuzin, Corenc; Marie-Claude Gentet, Crolles, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/463,545

(22) PCT Filed: Jul. 21, 1998

(86) PCT No.: PCT/FR98/01604

§ 371 Date: Apr. 3, 2000

§ 102(e) Date: Apr. 3, 2000

(87) PCT Pub. No.: WO99/05534

PCT Pub. Date: Feb. 4, 1999

(30) Foreign Application Priority Data

Jul. 23, 1997 (FR) ................................................. 97 09363

(51) Int. Cl.[7] .................................................. G01R 31/00
(52) U.S. Cl. ................ 324/96; 324/92; 324/765; 324/752; 29/874; 29/876; 340/870.28
(58) Field of Search .............................. 324/96, 765, 752; 327/92; 340/870.28; 29/874, 876

(56) References Cited

U.S. PATENT DOCUMENTS

| | | |
|---|---|---|
| 4,482,863 | 11/1984 | Auston et al. . |
| 5,181,026 | * 1/1993 | Granville ................. 340/870.28 |
| 5,434,426 | * 7/1995 | Furuyama et al. ................ 250/551 |
| 5,471,162 | 11/1995 | McEwan . |
| 5,593,606 | * 1/1997 | Owen et al. ................ 219/121.71 |
| 5,841,099 | * 11/1998 | Owen et al. ................ 219/121.69 |

FOREIGN PATENT DOCUMENTS

| | | |
|---|---|---|
| 0327420A1 | 8/1989 | (EP) . |
| WO 93/13427 | 7/1993 | (WO) . |

* cited by examiner

*Primary Examiner*—Glenn W. Brown
*Assistant Examiner*—Wasseem H. Hamdan
(74) *Attorney, Agent, or Firm*—Harness, Dickey & Pierce

(57) ABSTRACT

The present invention relates to a device for analyzing a single electrical pulse, which device comprises an electrical circuit made up of a propagation line, including, in uniformly-distributed manner, optoelectronic switches constituted by photoconductor tabs, each of them being connected to a corresponding analysis line, and an optical device (34 -1, 34-2, 34-3, 34-4, 34-5) making it possible to light the switches with a laser beam or with portions of a laser beam, any two adjacent switches being lit successively and not simultaneously.

15 Claims, 9 Drawing Sheets

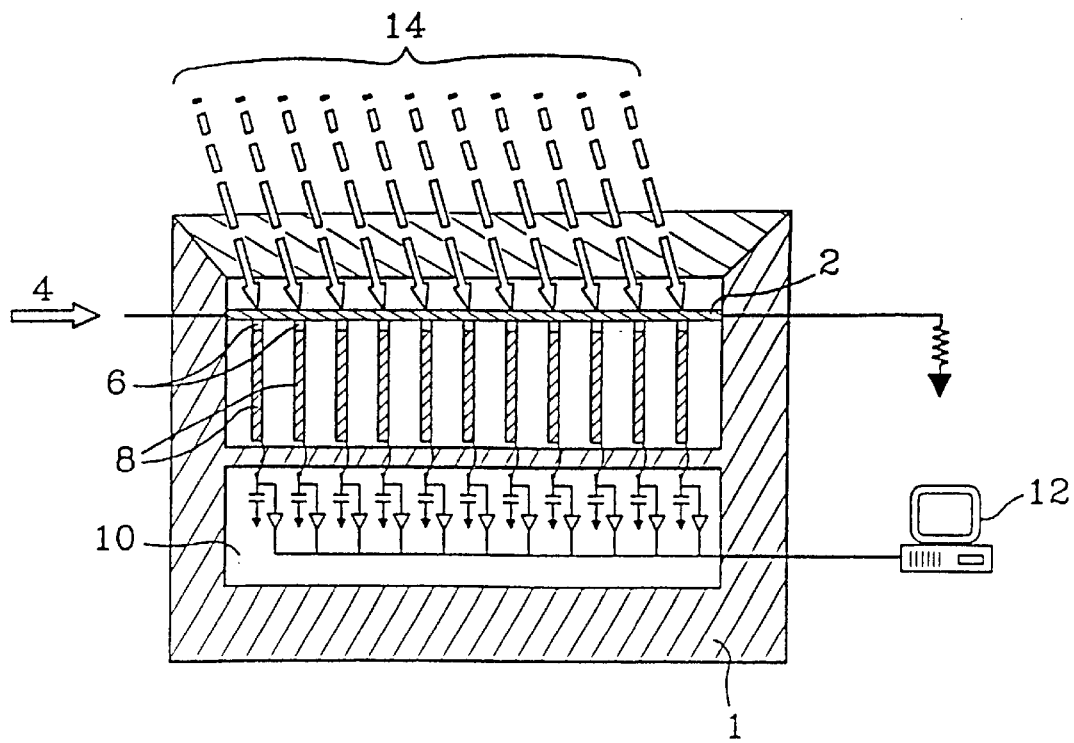
FIG. 1  *Prior Art*
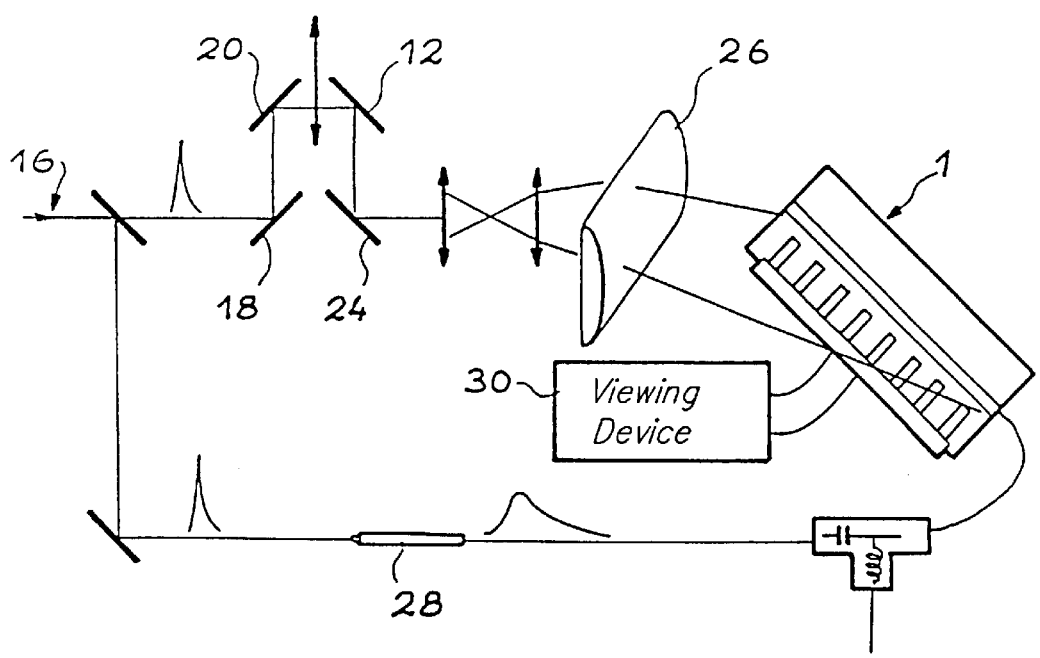
FIG. 2  *Prior Art*

DEVICE FOR ANALYZING A SINGLE PULSE WITH VARIABLE STEP

TECHNICAL FIELD

The invention relates to the technical field of electrical samplers, in particular for pulses having short or very short durations.

The metrology of pulses makes it possible to describe the variation over time "time" of a signal or of an electrical pulse, in particular the time variation of its voltage or of its energy, when the signal or pulse is single (non-repetitive) and very short (i.e. having a duration of about a few tens of picoseconds).

Such pulses to be measured are generally output by very fast radiation detectors which convert into electrical pulses the energy from a radiation pulse that they receive, e.g. an X, gamma, visible, or infrared radiation pulse. Such radiations can be emitted by ultra-fast radiation sources, such as lasers or synchrotron radiation sources, or they can result from a laser-matter interaction caused by an ultra-fast laser (i.e. a laser whose pulse duration is in the domain of the picosecond or of the femtosecond).

The invention is applicable to any measurement of a short and non-repetitive electrical signal, in particular in event physics, or in event measurement, the events in question being generated by picosecond phenomena.

STATE OF THE ART

Sampling oscilloscopes for measuring signals of spectrum extending to 50 GHz or 70 GHz are currently available on the market. Such instruments make it possible to measure repetitive frequencies. The sampling frequency is variable, typically over the range 250 kHz to 1 GHz.

Instruments for measuring single pulses are also commercially available. They make it possible to yield a spectrum up to 10 GHz.

However, it is necessary, in particular for oscilloscopes, to have a picosecond light source that is synchronous with the electrical pulse to be analyzed, which restricts the field of applications.

Devices are also known that are based on the principle of spatial sampling of a pulse propagating along a propagation line. There results a spatial equivalence of the time variation of the pulse which propagates along the line at a speed dependent on the physical characteristics of said line. At a determined instant t, if the line is of sufficient length, the entire pulse is distributed spatially along the line.

If samplers are disposed along the propagation line, by actuating them simultaneously, it is possible to perform full sampling of the pulse, with a time pitch equal to the spatial pitch of the samplers, divided by the speed of propagation.

In particular, document EP-327 420 describes an optosampler device that measures signals of passband up to 35 GHz. That device is shown in FIG. 1. It includes a propagation line 2 in which a pulse signal 4 to be measured is introduced and along which said signal propagates. Sampling gates 6 made of a photoconductive material (CdTe) are distributed uniformly along the propagation line. The sampling gates are associated with tapping lines 8, each of which is itself followed by means for reading the charges. All of the means for reading the charges are placed together in a device 10 for reading the charges. The means for reading the charges are connected to a computer 12 programmed to measure the charges relating to each channel and to analyze the pulse 4. Each sampling gate 6 is closed by means of a triggering light pulse 14: as many triggering light pulses as there are sampling gates are necessary. That device thus requires a picosecond optical flash of a few tens of nanojoules in order to trigger the sampling.

Each of the samplers (photoconductors) of that device thus taps a portion of the signal present at its level along the line. They are placed in parallel with the propagation line.

An optoelectronic sampling system incorporating a device of the above-described type is disclosed in the thesis by Vincent Gerbe (Université Joseph Fourier, Grenoble, Sep. 24, 1993). That system is shown diagrammatically in FIG. 2. It includes a sampler 1 having 16 photo-switches and operating on the principle described above with reference to FIG. 1. A picosecond laser (not shown in the figure) delivers pulses 16 at a rate of 0.2 hertz, and at a wavelength of 0.53 $\mu$m. A set of mirrors 18–24 constitutes an optical delay. The beam is then focussed by means of a cylindrical lens 26 onto the set of photoconductors. The irradiated area is thus about 4 cm×100 $\mu$m.

A pulse to be analyzed (of width at half height equal to about 150 picoseconds) is generated by a detector 28 of the n-preirradiated GaAs type lit by a portion of the beam. The pulse can be viewed, after sampling, on a viewing device 30.

The sampling device 1 is provided with 16 sampling channels, the sampling pitch being 18 picoseconds. The main line has a length L=40 mm for a working length $L_u$=32 mm.

Such a device is fixed as regards the total length of the pulse that the device is capable of analyzing. Similarly, it is fixed as regards the sampling pitch and thus the accuracy with which the pulse is to be analyzed: the sampling interval $\Delta T$ is equal to $$\frac{p}{V_c},$$

where p is the distance between two photoconductors and $V_c$ is the speed of propagation of the signal in the line 2.

In addition, the ultra-fast laser pulse (time width lying in the range 1.2 picoseconds to 1.6 picoseconds, and energy per pulse lying in the range 200 $\mu$joules to 300 $\mu$joules) has an elliptical shape (43×0.4 mm²), i.e. an area of about 7 mm². Each photoconductor tab has dimensions of about 120 $\mu$m²×20 $\mu$m², i.e. an area of about $2\times10^{-3}$ mm² per photoconductor. For each photoconductor, the efficiency, as defined by the ratio between the injected power and the working power, is thus very low.

It is thus desirable to find an optical system that makes it possible to increase the efficiency of the injected power/working power.

Another problem related to the optical interface of that system is the use of a cylindrical lens 26: the laser, which in that example is a frequency-doubled YAG laser, has poor stability from one shot to another, and that instability is added to the instability created by the use of the lens. The photoconductor tabs do not therefore receive the same energy each time the laser is fired. It would thus be desirable to have an optical interface making it possible to attenuate the influence of the spatial instabilities, while also being simple to implement.

STATEMENT OF THE INVENTION

The invention firstly provides a device for analyzing a single electrical pulse, which device comprises an electrical circuit made up of a propagation line, including, in uniformly-distributed manner, optoelectronic switches constituted by photoconductor tabs, each of them being connected to a corresponding analysis line, and an optical device making it possible to light the switches with a laser beam or with portions of a laser beam, any two adjacent switches being lit successively and not simultaneously.

The photoconductors are thus sampled successively, which, with the same propagation structure, makes it possible to sample with a pitch that is smaller or larger than the pitch corresponding to the spacing between the lines on the structure.

Thus, the optical device makes it possible to use the analysis device in variable ranges as regards both the total length of the pulse that it is capable of analyzing, and also the sampling pitch (and thus the accuracy) with which the pulse is to be analyzed.

The invention also provides a device for analyzing a single electrical pulse, which device comprises an electrical circuit made up of a propagation line, including, in uniformly-distributed manner, optoelectronic switches constituted by photoconductor tabs, each of them being connected to a corresponding analysis line, and an optical device making it possible to light the switches with portions of a laser beam, each portion of the beam corresponding to a respective switch, said optical device making it possible to impart an optical delay between two adjacent portions of laser beam corresponding to two adjacent photoconductors of the propagation line.

The use of an optical device having (positive or negative) optical delays makes it possible to use the electrooptical device in variable ranges as regards:

the total length of the pulse that the device is capable of analyzing; and the sampling pitch and thus the accuracy with which said pulse is to be analyzed.

In a particular embodiment of the invention, the optical device comprises a bundle of optical fibers of lengths that vary from one fiber to another.

This system is easily interchangeable. If, from one fiber to the other, the total length is increased by $\Delta\square$, the sampling interval is caused to vary by about $\pm\Delta\square/V_f$, where $V_f$ is the propagation speed of light in the fiber. In addition, the energy efficiency of this system is better than in the case when a single cylindrical lens is used. This system is further very simple to implement.

The fibers can be positioned in grooves in an etched substrate.

Focusing means may further be disposed at the outlets of the optical fibers, e.g. in a groove or in cavities etched in the substrate.

Advantageously, the fibers are held at one end in a holding tube and at the other end in a holding device.

In another embodiment, the optical device comprises an energy distributor made up of optical waveguides formed in a substrate.

The efficiency of the system is then very good.

In another embodiment, the optical device comprises a reflector provided with reflective zones disposed so as to impart an optical delay.

The system then has energy efficiency that is better than that obtained using a single cylindrical lens.

In yet another embodiment, the optical device comprises a stepped device imparting a delay from one beam portion to another.

The invention also provides a device for analyzing a single electrical pulse, which device comprises an electrical circuit made up of a propagation line, including, in uniformly-distributed manner, optoelectronic switches constituted by photoconductor tabs, each of them being connected to a corresponding analysis line, and an optical device making it possible to light the switches with a laser beam, the optical device comprising a plane mirror situated parallel to the propagation line and to the analysis lines.

The efficiency of such a device is better than with a single cylindrical lens. This system is further very flexible since it can analyze short or long pulses, regardless of the pitch p of the photoconductors along the line.

Regardless of the embodiment considered, the photoconductors may be disposed along the propagation line at a pitch greater than the pitch $p_m$ defined by:

$$\frac{2(p_m - L)}{V_c} = t$$

where L is the width of an analysis line, $V_c$ is the speed of propagation of an electric signal in the propagation line, and t is the mean recombination time of the photoconductors.

This makes it possible to ensure that the return of an electrical pulse, due to impedance mismatching at each tab, does not disturb the sampled signal.

In addition, the n photoconductor tabs are preferably disposed along the propagation line at a pitch p, a distance b separating the first tab of the line from the end of the line, the following relationship being satisfied for any tab $N(2 \leq N \leq n)$ and for any k, $1 \leq k \leq N-1$:

$$2b \neq k\Delta t V_c - p[k+2(n-N)]$$

where $V_c$ designates the speed of propagation of an electric signal in a line and where $\Delta t$ is the duration of the time interval between the lighting, by the laser beam, of two adjacent tabs.

Thus the sampling is not disturbed on all of the photoconductor tabs when one of the tabs is illuminated.

Similarly, the tabs are preferably disposed along the line at a pitch p, the duration $\Delta t$ of the time interval between the lighting by the laser beam of two adjacent tabs being such that:

$$\frac{p}{V_c} \neq \Delta t$$

where $V_c$ is the speed of propagation of an electrical signal in the propagation line.

The second disturbance created by each light pulse on each tab does not then disturb the sampling of the other tabs.

BRIEF DESCRIPTION OF THE FIGURES

In any event, the characteristics and advantages of the invention will appear more clearly on reading the following description. This description relates to embodiments given by way of non-limiting explanation, with reference to the accompanying drawings, in which:

FIG. 1 shows an opto-sampler of the prior art;

FIG. 2 shows an opto-sampler system of the prior art;

DETAILED DESCRIPTION OF EMBODIMENTS OF THE INVENTION

In the invention, instead of lighting the photoconductors simultaneously in an opto-sampler of the type described above with reference to FIG. 1, the photoconductors are lit successively. If the lighting is performed at successive instants separated by Δt, the photoconductor i is illuminated at the instant:

$$t_i = T_0 + (n-i)\Delta t$$

where $T_0$ represents the instant at which the photoconductor n is lit.

The sampling interval ΔT of the electrical signal is thus as follows:

if the first tab illuminated is the first tab seen by the signal:

$$\Delta T = \Delta t - p/V_c$$

if the first tab illuminated is the last tab seen by the signal:

$$\Delta T = \Delta t + p/V_c$$

where p is the pitch between two adjacent photoconductors and $V_c$ is the speed of displacement of the signal in the propagation line.

In the first case, ΔT may be negative of positive.

Thus, depending on the case, the successive sampling of the photoconductors makes it possible, with the same propagation structure, to sample with a pitch that is smaller or larger than the pitch corresponding to the spacing between the lines on the structure.

Figure 3:
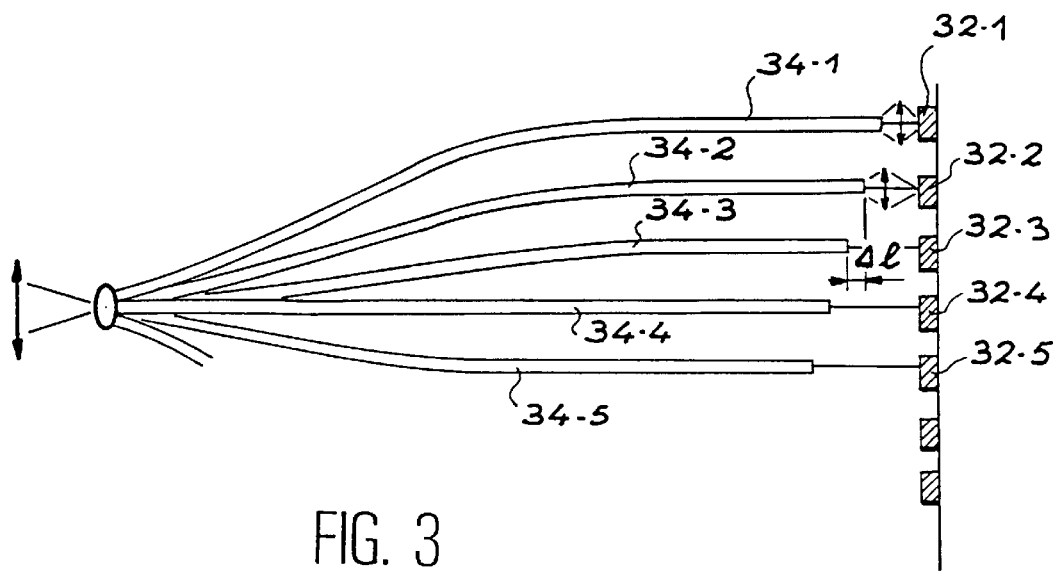
FIGS. 3 to 8 relate to a first embodiment of the invention, implementing optical fibers.

A first embodiment is described below with reference to FIG. 3. In FIG. 3, the references 32-1, ... , 32-5 designate photodetector tabs of an analysis device of the type described above with reference to FIG. 1. A bundle of n fibers (n=number of photodetector tabs) is provided, which fibers fan out in a linear positioning system, with a pitch corresponding to the pitch p of the tabs. The free end of each of the fibers 34-1, ... , 34-5 faces a respective photodetector tab. The dimensions of each of the tabs are g×l where g designates the gap, and where l designates the width of the tab. Typically, g=50 μm, and l=120 μm. g must be large enough to avoid deformation of the signal propagating along the line under the capacitive influence of the sampling lines. However, if g is too large, it reduces the sensitivity of the system.

In addition, the tabs are spaced apart from one another by a certain pitch, defined by the desired sampling interval (e.g. a pitch of 700 μm corresponding to ΔT=6 picoseconds).

The fibers are of increasing length, the lengths preferably increasing uniformly: the length of fiber 34-1 is greater than the length of fiber 34-2, which is itself greater than that of fiber 34-3, etc. The distance between the outlets of the fibers and the photodetector tabs of the analysis device is constant.

Preferably, the fibers are index-gradient multimode fibers, which makes it possible to obtain dispersion that is quite low. For example, they may be fibers having a core diameter of 100 μm, a cladding diameter of 140 μm, and a numerical aperture of 0.29 ("PSI" fibers) or else fibers having a core diameter of 50.5 μm, a cladding diameter of 125 μm, and a numerical aperture of 0.21 ("NSG" type fibers).

Figure 4:
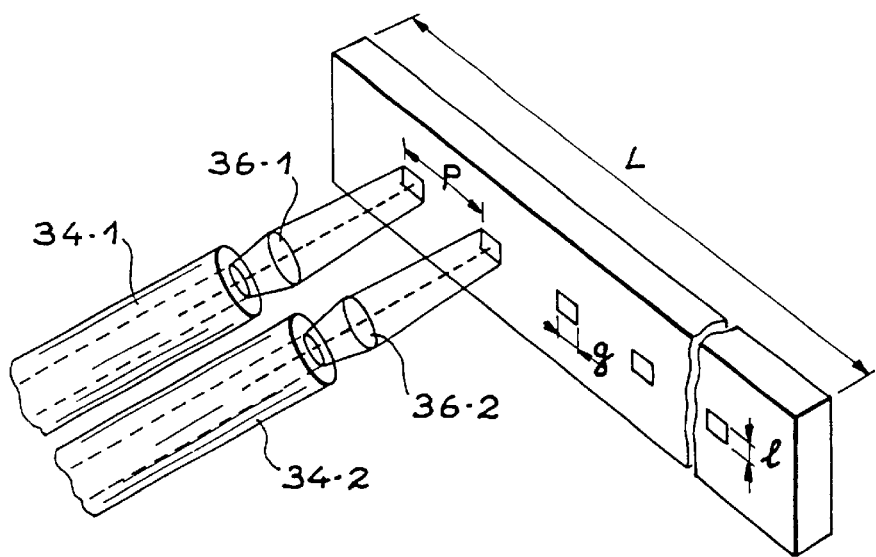

FIG. 4 is a perspective view showing the positioning of two fibers 34-1, 34-2 facing a strip 32 of photodetectors. A respective lens 36-1, 36-2 may be disposed in the path of the beam, between the outlet face of each of the fibers and the corresponding photodetector tab.

Preferably, the outlet faces of the fibers are situated at more than 0.5 mm from the photodetectors 35-1 or from the strip 32 of photodetectors. At such a distance, there is no problem of the electrical signal flowing through the line being disturbed, and it is also possible to overcome any problems that could be posed by flatness defects in various elements.

Preferably, for each beam, provision is made to obtain a diameter at half height on the strip 32 substantially equal to g (e.g. 50 μm), which can be implemented by the focussing lenses 36-1, 36-2.

The fibers may be integrated in a block of fibers that holds them together.

Similarly, a strip may integrate the n lenses 36-1, 36-2 spaced at the pitch p from the tabs, thereby simplifying positioning of the resulting assembly.

Figure 5:
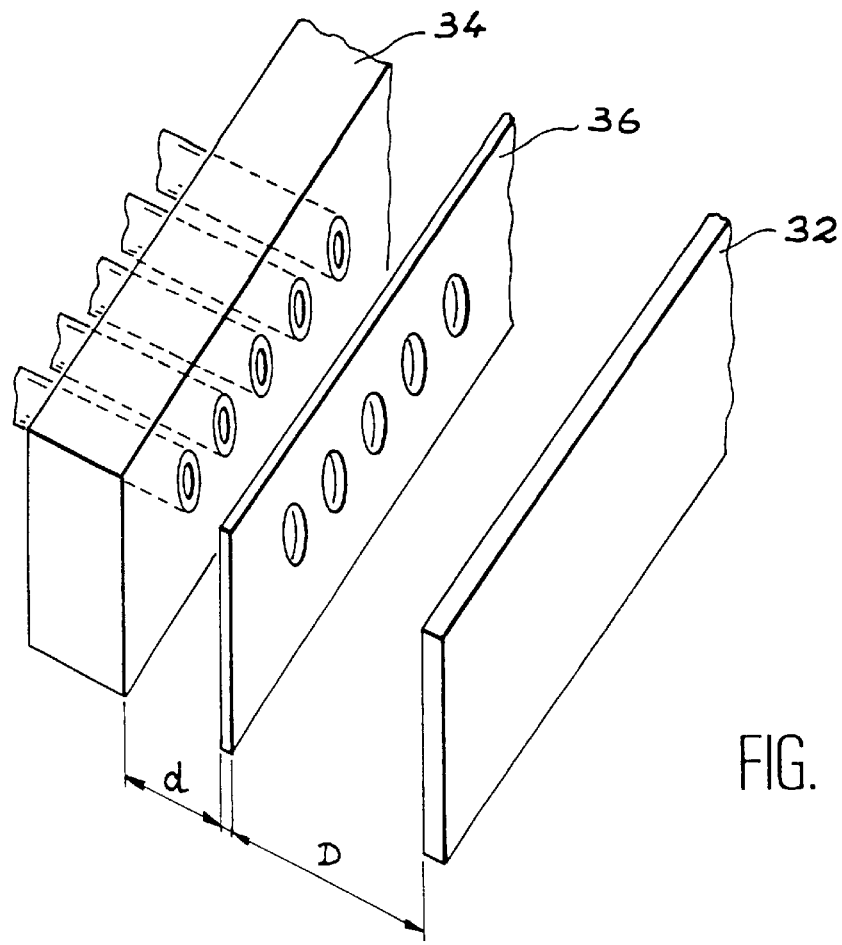

FIG. 5 shows an assembly configuration comprising a strip 32 of photodetectors, a strip 36 of lenses, and a device 34 for holding the fibers. The distance D between the strip of lenses 36 and the strip 32 of photodetectors is, as mentioned above, preferably greater than or equal to 0.5 mm. The distance d between the strip of lenses and the device for holding the fibers may be variable: for example, it may be equal to 0 (the two devices 34 and 36 are then glued together.

Figure 6:
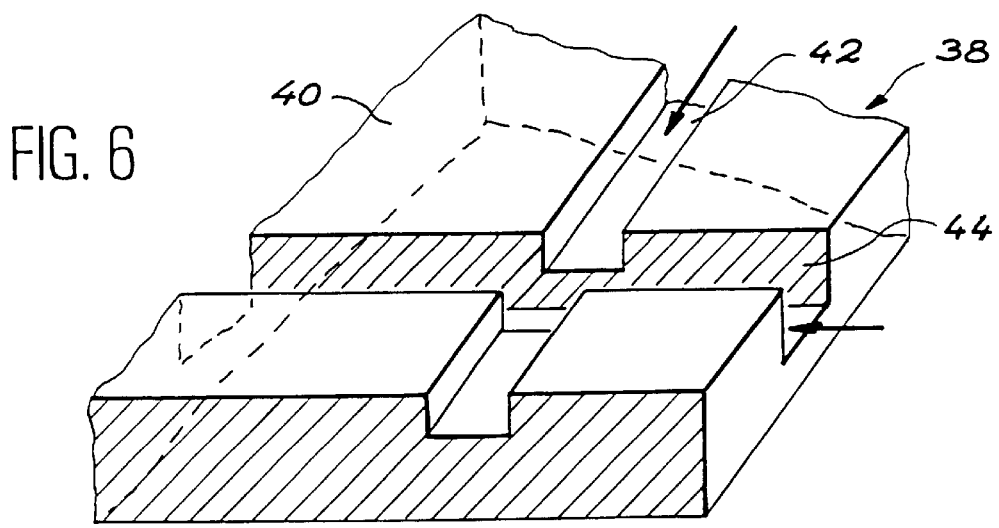
Figure 7:
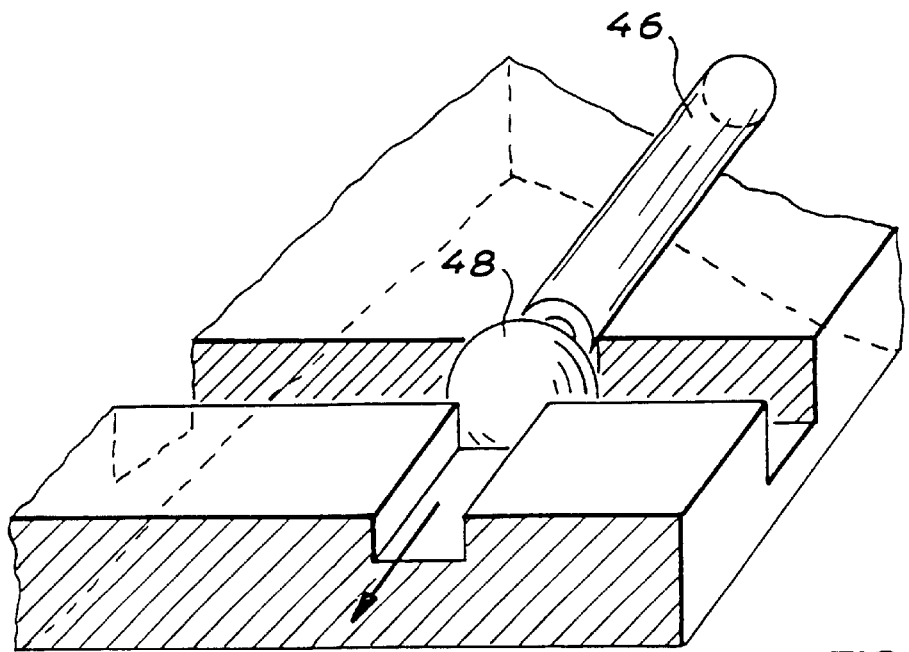

Another device 38 for linearly positioning and holding the fibers is shown in FIG. 6. This device comprises a machined substrate 40, e.g. made of ceramic. The machining makes it possible to provide a channel 42 for each fiber. Focusing means, e.g. beads, may also be held by the substrate. For example, as shown in FIG. 6, a channel 44 is provided in which a focusing bead may be inserted and held at the outlet of the fiber. FIG. 7 shows the support 38 in which a fiber 46 and a focusing bead 48 have been inserted. The support 38 makes it possible to position and to glue the beads in the groove 44. Instead of the groove, it is possible to provide microcavities. Similarly, the fibers are glued in the channels 42 provided for this purpose.

Figure 8:
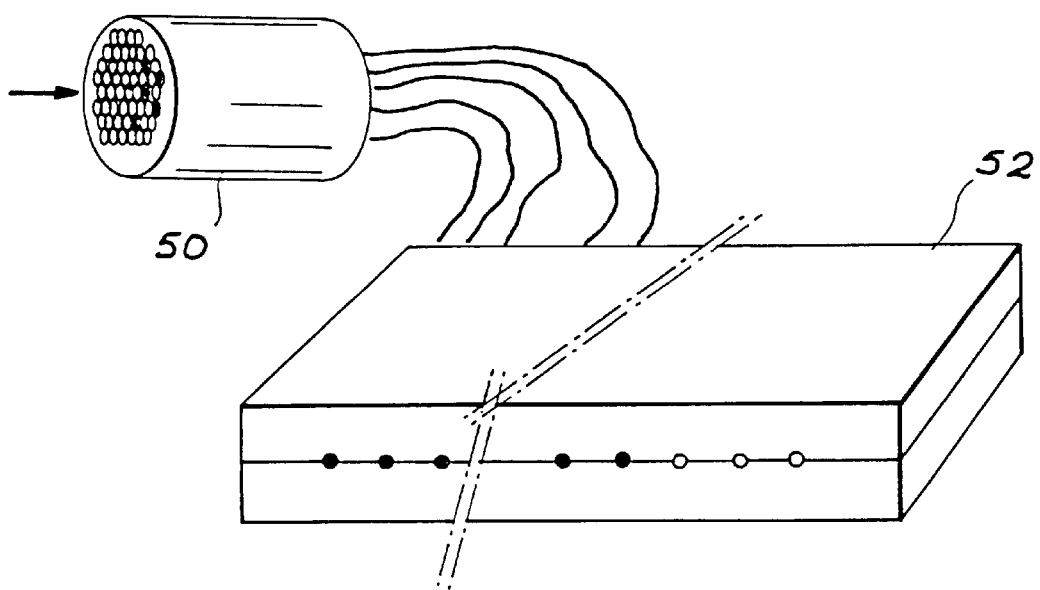

FIG. 8 shows how the fibers are mounted firstly in a holding tube 50 (at the end at which the laser beam is injected into the fibers) and secondly in a device 52 for holding and linearly positioning the fibers.

For example, the fibers may be about 15 cm long, and they are brought together in a bundle which is placed facing the laser that delivers the pulses, e.g. a frequency-doubled YAG laser (frequency equal to 530 nm). Such a laser device can deliver a sub-picosecond pulse. If it is desired to deposit a few nanojoules on each photoconductor tab (which is necessary in order to reduce the resistivitiy of the photoconductor considerably), the power at the outlet of each fiber is thus about a few kilowatts.

The multimode fibers used, which have an index gradient (which makes it possible to obtain low dispersion and to inject considerable power), have a tolerance between them of ±100 μm in length (which corresponds to ±0.5 picoseconds in the fiber). Preferably, the fibers are bare in the collective holding tube 50 and are not bare in the linear-positioning substrate 52.

Figure 9:
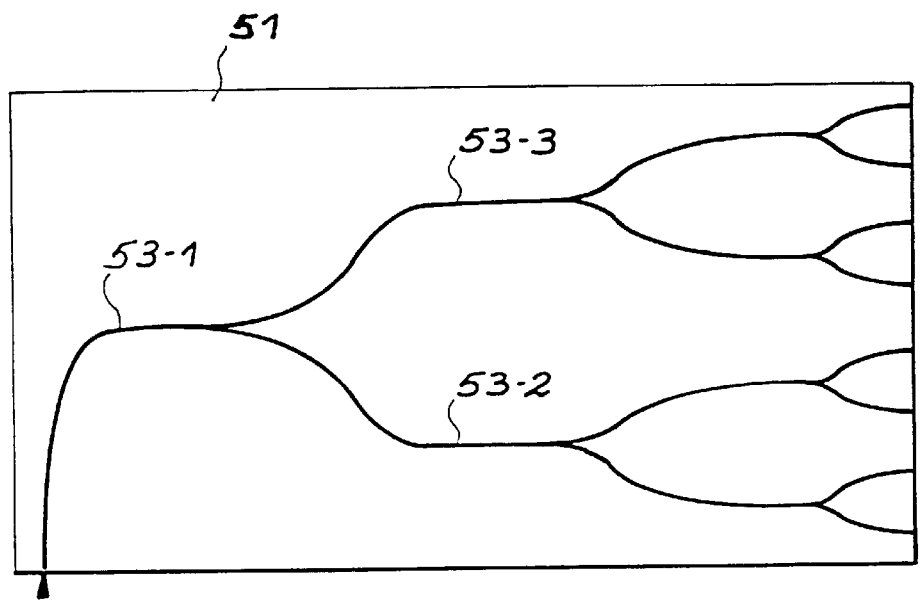
FIG. 9 shows a second embodiment of the invention, with guided optics.

Another embodiment of the invention is explained with reference to FIG. 9. This embodiment involves optically guiding the laser beam in an energy distributor 51. FIG. 9 shows a 1-to-8 distributor. Optical waveguides 53-1, 53-2, 53-3, . . . are formed, for example, of silver diffused zones buried in a glass substrate, as described by F. ST ANDRE, P. BENECH, A. KEVORKIAN, "Modelisation of a semi-leaky waveguide, SPIE, vol. 1583 (1981). Preferably, multimode waveguides are used. However, potassium monomode waveguides may also be used. The lengths of the various waveguides make it possible to obtain the desired time offsets at the outlets of the distributor 51.

Figure 10:
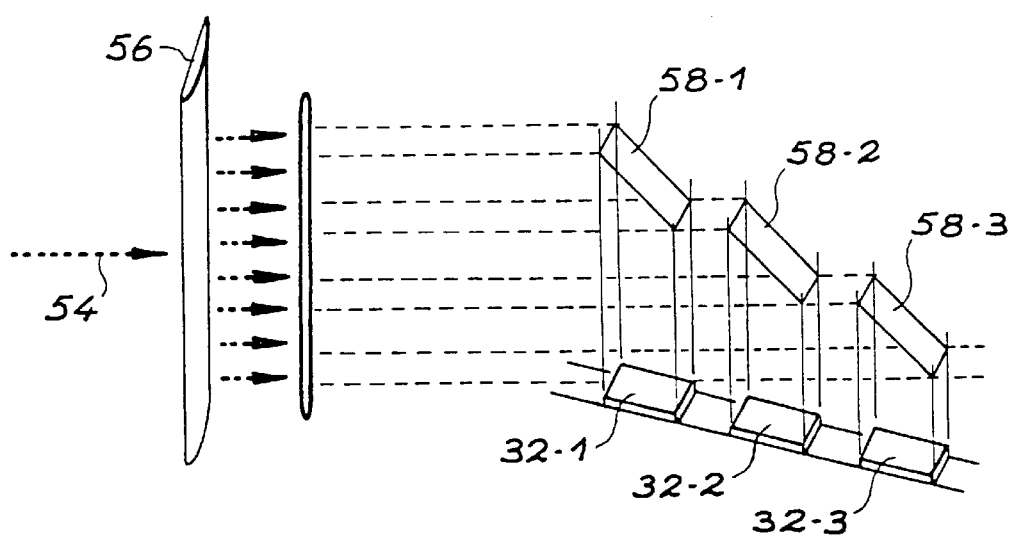
FIGS. 10 and 11 relate to a third embodiment of the invention, with reflective surfaces.

Another manner of obtaining a device for forming time-offset laser pulses is to implement a stepped reflective structure as shown in FIG. 10. In this figure, reference 32 also designates a strip of photoconductors 32-1, 32-2, 32-3. A pulsed laser beam 54 passes through a cylindrical lens 56. Reflective zones 58-1, 58-2, 58-3 make it possible to direct portions of the laser beam onto respective ones of the photoconductor elements. The reflective elements are disposed such that the optical path length increases from one beam to another: thus, the photoconductors are not illuminated simultaneously, but rather they are illuminated at different instants. The sampling interval between two successive illuminations is fixed.

Figure 11:
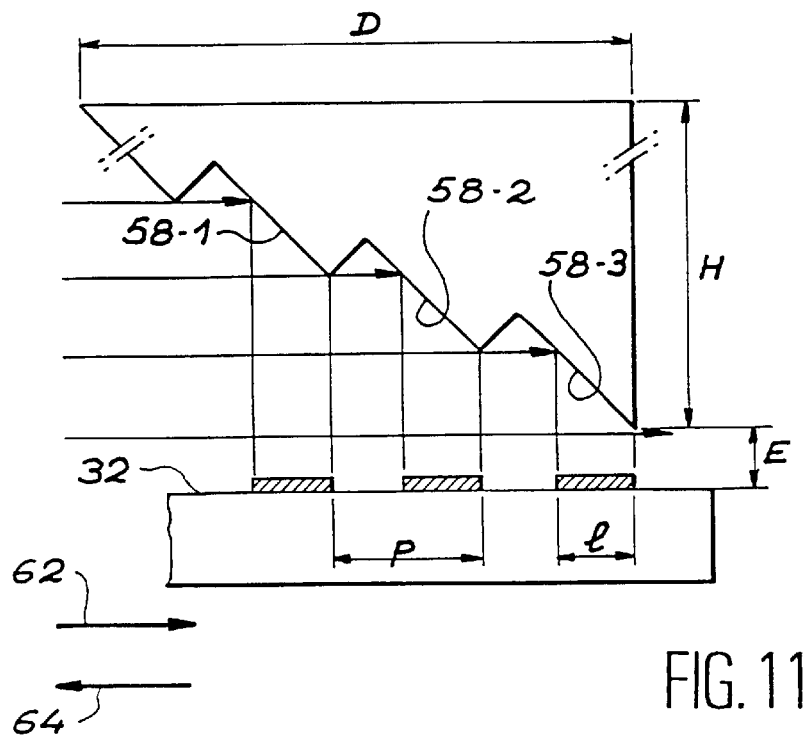

This embodiment is also shown in FIG. 11. The reflective zones 58-1, 58-2, 58-3 are formed at the surface of a support 60 of sides H and D. The bottom edge of the support is disposed at a distance E from the strip 32 of photoconductors. If there are n photoconductors, the following values are chosen: H=n×l and D=(n−1)×p+l, where p and l designate respectively the pitch of the array of photoconductors and the width of a photoconductor. The sampling interval ΔT is then equal to:

ΔT=(p−l)/c−p/$V_c$ when the signal is injected in direction 62; and

ΔT=(p−l)/c+p/$V_c$ when the signal is injected in direction 64.

In these formulae, c is the speed of light (1.3 mm per picosecond), and $V_c$ is the speed of propagation of the electrical signal in the line 32 (for a ceramic $V_c$=1 mm×8.5 picoseconds).

It is thus possible to adjust the pitch p as a function of the desired interval ΔT for either one of the displacement directions of the signal.

The distance E is not involved in varying ΔT. It is thus possible to place the stepped mirror quite a long way from the strip of photoconductors 32. It can be seen that, for reasonable pitches, it is possible to have varied and small values for ΔT. This system makes it possible to obtain better energy efficiency than with a single cylindrical lens.

Other embodiments use the differences in speed of a laser pulse in glass and in air: $V_{glass}$≈200 μm/ps, c=300 μm/ps.

Figure 12:
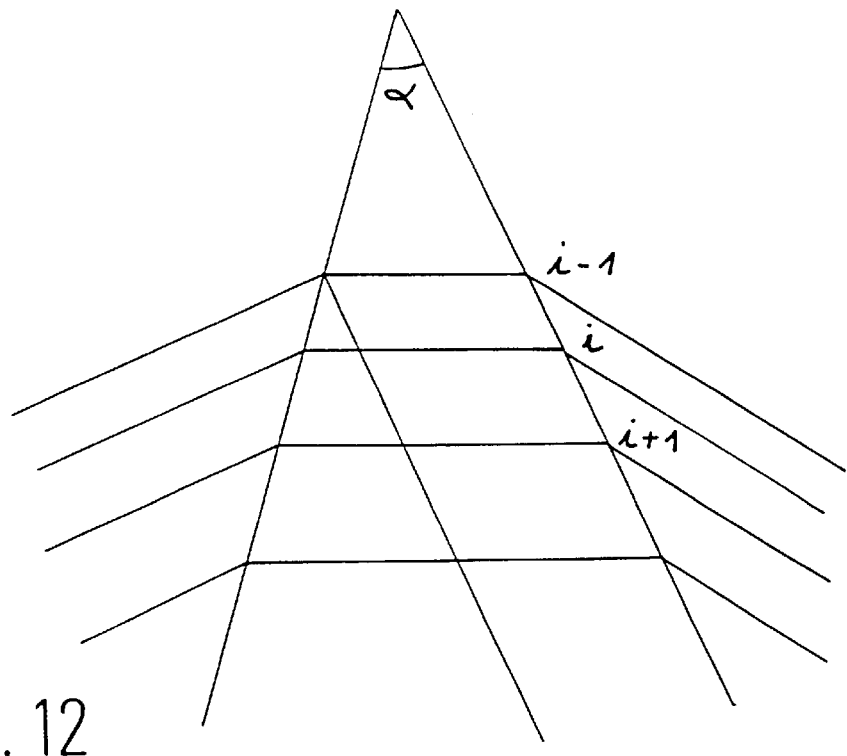
FIG. 12 relates to a fourth embodiment, in which the parallel beam, whose wavelength for lighting the photoconductors is fixed, passes through a prism.

In an embodiment shown in FIG. 12, the parallel beam, whose photoconductor-lighting wavelength is fixed, passes through a prism of vertex angle α.

Two beams serve to light two photoconductor tabs spaced apart by p, following paths whose geometrical lengths have a difference psinα if the beam enters and exits normally respectively at the inlet surface and the outlet surface.

Two successive tabs are then lit with a time offset $$\Delta t = \frac{p\sin\alpha}{v},$$

where V is the speed of light in the prism.

Figure 13:
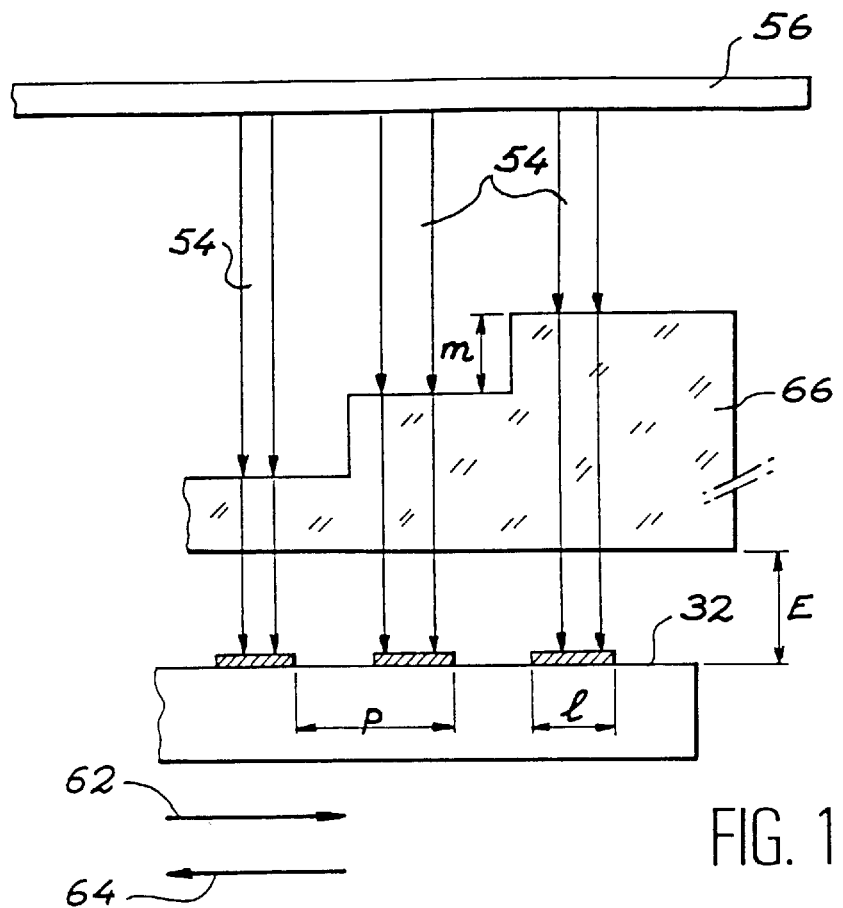
FIGS. 13 and 14 relate to a fifth embodiment of the invention, with optical steps.

Another embodiment is shown in FIG. 13 in which reference 56 also designates a cylindrical lens. The laser beam 54 encounters in its path a glass flight of steps 66, each of which has a height m and corresponds to a respective photoconductor tab of a strip 32 of photoconductors. The flight of steps is situated at a distance E from the strip 32. At each step, and for each photoconductor tab, the pulse has a delay, relative to the corresponding pulse of the preceding tab, of:

Δ$T$=(m/$V_{glass}$)−(m/c)=m×(c−$V_{glass}$)/($V_{glass}$×c)

The sampling interval ΔT is thus:

ΔT=Δt−p/$V_c$, when the signal is injected in direction 62; and

ΔT=Δt+p/$V_c$, when the signal is injected in direction 64.

Figure 14:
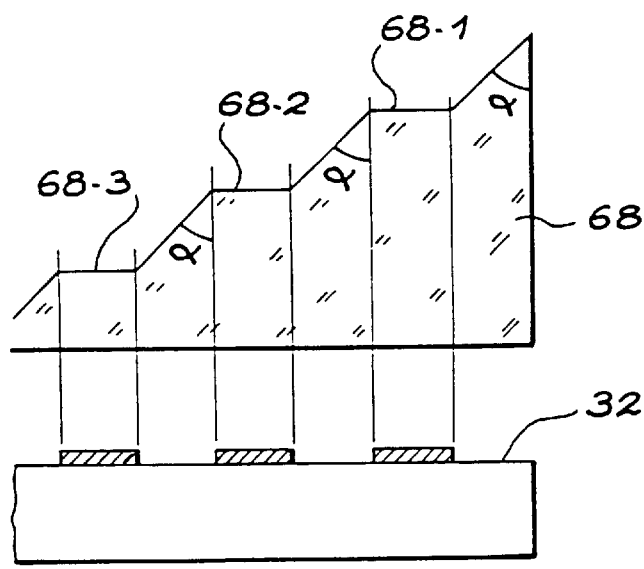

In order to avoid unwanted reflections, it is possible to use a flight of steps 68 having the shape illustrated in FIG. 14. The planes 68-1, 68-2, 68-3 of the various steps through which the various portions of the laser beam pass are interconnected by plane surfaces that are not perpendicular to them, but rather that slope at an angle α relative to the normal.

In this embodiment, steps of different step heights m give sampling intervals ΔT that vary. Similarly, with m being constant, varying the pitch p makes it possible to vary ΔT.

Figure 15:
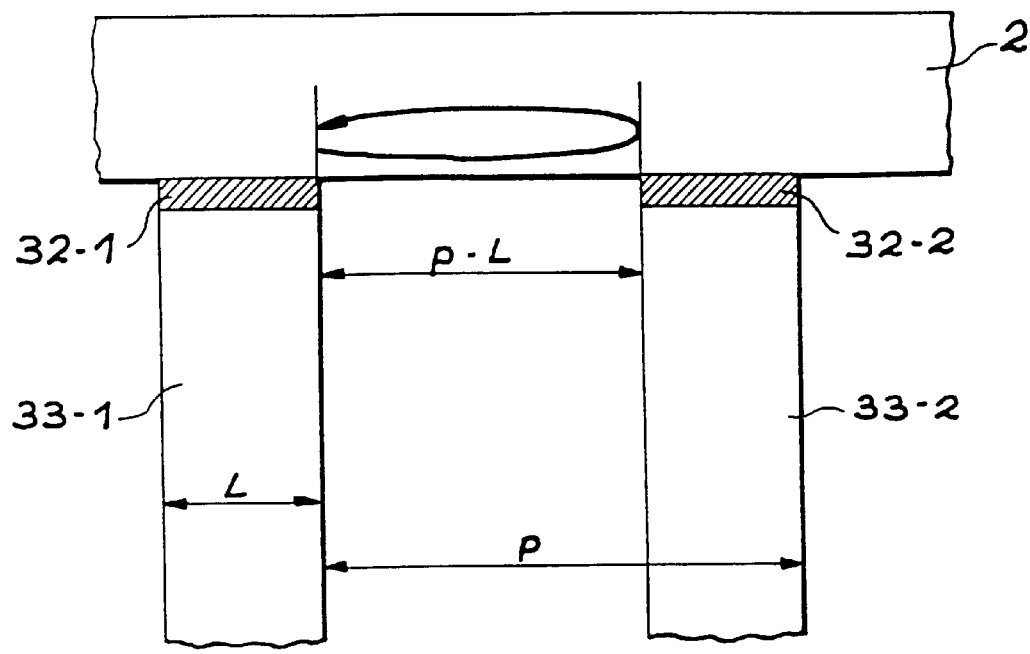
FIGS. 15 to 17 show the propagation of disturbances along the propagation line.

Regardless of the system chosen, a portion of the laser beam triggers a respective one of the photoconductors of the strip of photoconductors. Let t be the recombination time of each photoconductor (for example fast photoconductors may be considered for which t≈0.7 picoseconds). FIG. 15 shows two photoconductors 32-1, 32-2 with the corresponding sampling lines 33-1, 33-2 of width L. The pitch of the strip of photoconductors is p. At each tab, the electrical pulse propagating along the line 2 is subjected to an impedance variation, and therefore to a reflection. So that the return of the electrical pulse, caused by said reflection, is not taken into account, a minimum pitch $P_m$ is chosen, defined by:

2×($p_m$−L)/$V_c$=t.

Thus, if the width of the lines L is 120 μm, and $V_c$=118 μm/ps, the minimum pitch, for t=0.7 ps, is about 160 μm.

This condition thus makes it possible to avoid a disturbance being returned from the tab 32-2, which is problematic if the photoconductor 32-1 is still open.

Figure 16:
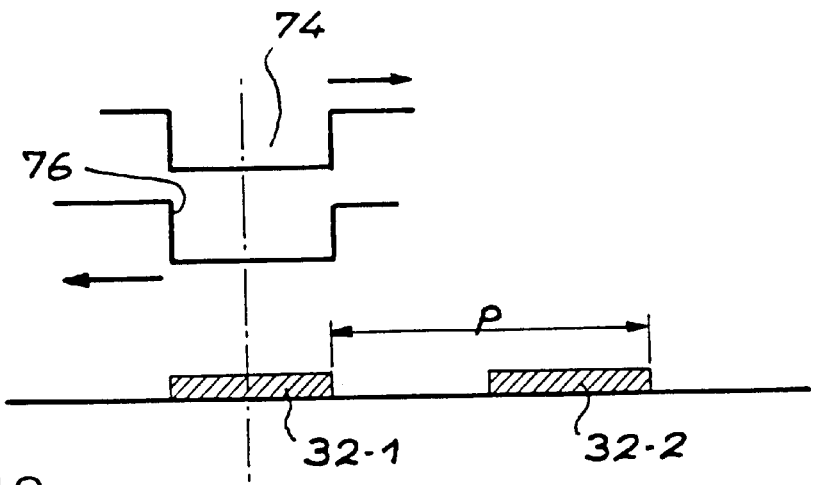

In addition, it is preferable to avoid the disturbances created by reading a photoconductor tab. As shown in FIG. 16, two disturbances are created on illuminating a tab 32-1. They are of width substantially equal to L, i.e. to the width of the tab. The two disturbances 74, 76 go off in opposite directions, at the same speed as the speed of propagation of the signal.

Consideration is given below to the case when ΔT=Δt+p/$V_c$.

Figure 17:
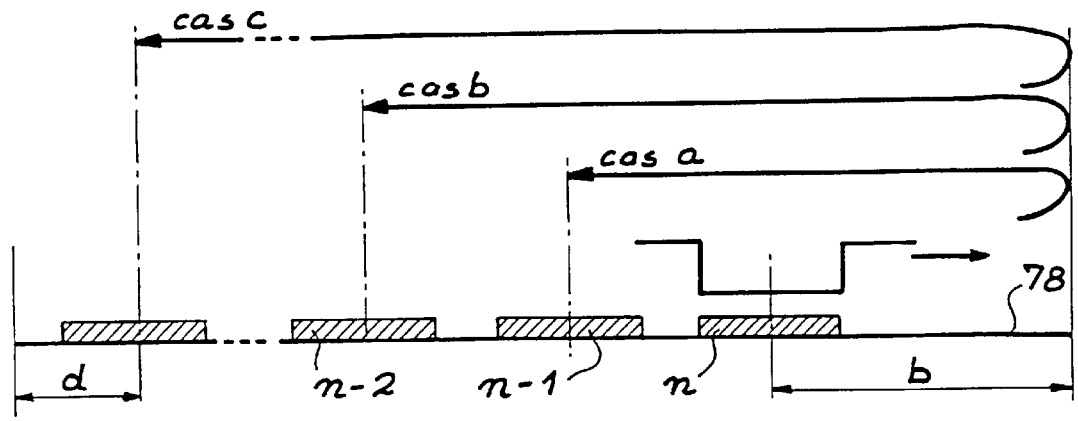

In addition, consideration is given to the diagram of FIG. 17 in which an illumination is created at the photoconductor tab n, which gives rise to a disturbance 74 moving in the direction of the signal. If, at the end 78 of the line, the impedance matching is not ideal, the disturbance can be reflected.

In order to prevent the disturbance 74 created at the tab n from reaching the preceding tab n−1 when it is illuminated in its turn Δt later, and, likewise, in order to prevent it from being on the tab n−2 when it is illuminated in its turn 2Δt later, etc., provision is made to try to satisfy the following condition:

(2b+p)/$V_c$≠Δt (2b+2p)/$V_c$≠2Δt

. . .

(2b+(n−1)p)/$V_c$≠(n−1)Δt.

Similarly, the pulse created at tab n−1 must find itself neither on the tab n−2 when said tab is being read, nor on the tab n−3 when said tab is being read, etc.

This means that the following conditions must be satisfied:

$(2b+2p+p)/V_c \neq \Delta t$ $(2b+2p+2p)/V_c \neq 2\Delta t$

...

$(2b+2p+(n-1)p)/V_c \neq (n-1)\Delta t$

Therefore, if at some time, the return disturbances (of the type of the disturbance 74) are not to be measured, the disturbance created at the tab N ($2 \leq N \leq n$) must not find itself on a tab while said tab is being read:

$(2b+kp+2(n-N)p/V_c) \neq k\Delta t$, for $1 \leq k \leq N-1$ i.e.: $2b \neq k\Delta t V_c - p(k+2(n-N))$.

As regards the disturbance 76 (propagating in the other direction), it is desired to prevent said disturbance, created by the flash at tab n, from being on another tab when said other tab is lit. This means that:

$p/V_c \neq \Delta t$

An embodiment is given below that enables pulses to be analyzed with sampling intervals of 9 picoseconds (which corresponds to a frequency of about 50 gigahertz) and 64 measurement points. With no optical delay, over a rectilinear propagation line, it is necessary to provide working lengths of 6.8 cm (length from the first tab to the last tab). Such a length is too long for two reasons. Firstly, standard substrates made of sapphire or alumina have diameters of 5 cm (it is however possible to find large and even rectangular substrates but that gives rise to an enormous loss of homogeneity in the deposited layers of fast semiconductors). In addition, the attenuation of the signal over such a length is very large, in particular when the frequency is high (attenuation of about −1 dB over a line of 1 cm at 30 GHz). It is therefore desirable to reduce the working length and to delay the laser pulses so as to obtain a sampling interval of 9 ps.

Let us consider a pitch of 180 $\mu$m, corresponding to a time of 1.5 $\mu$m in ceramic. For 64 points, this corresponds to a working length of 1.13 cm. In the case when the first tab lit is the last tab seen by the signal, it is therefore necessary to provide a laser pulse delay of (9−1.5)ps, i.e. $\Delta t$=7.5 ps ($\Delta T = \Delta t +$ $(\Delta T = \Delta t + (\Delta t = \Delta t + \frac{\text{pitch}}{V_{Ceramic}})$.

By using the bundle of fibers (described above with reference to FIG. 8) as the optical solution, it is necessary to provide a length difference $\Delta l$=1.5 mm between two consecutive fibers, which makes a total difference of 9.45 cm (between the longest fiber and the shortest fiber, for 64 points, thus with 64 fibers). An attenuation of about −1.5 dB is thus obtained for a frequency of 50 GHz, which is very reasonable.

It is thus possible to verify that the reflected disturbances reflected at the end of the line because of poor impedance matching are not measured. This gives the following conditions: n=64, N varies from 2 to 64, $\Delta t$=7.5 ps, p=180 $\mu$m, $V_{ceramic}$=118 $\mu$m/ps $ \left(\frac{p}{V_c}\right) = \frac{180}{118} = 1.5 \text{ ps} \neq \Delta t \text{ chosen } \Delta t \text{ of 7.5 ps}$ 1.5 ps$\neq \Delta t$ chosen $\Delta t$ of 7.5 ps $ \left(\frac{2b + kp + 2(64-N)p}{v_c}\right) \neq k\Delta t \text{ for } k = 1 \text{ to } (N-1),$ $k\Delta t$ for k=1 to (N−1), where $2b \neq k\Delta t V_c - p[k+2(64-N)]$ For this condition, the minimum annoyance distance b is 172.5 $\mu$m and the maximum annoyance distance b is 2.22 cm.

To conclude, the device proposed has a total line length such that:

$L_{tot}$=180*(number of points)+$b_{chosen}$, i.e. (64×180+25000)=36520 $\mu$m=3.652 cm The optical interface is a system of 64 fibers whose length difference between any two adjacent fibers is 1.5 mm. They may be positioned facing tabs with a linear positioning system.

The advantage of such a device is to make it possible to analyze pulses that are even longer, either by keeping 64 points and by increasing the illumination delay from one tab to another (solution II), or by increasing the number of points while keeping the illumination delay from one fiber to the next (solution III). These two solutions, together with the first solution (I) explained above, are described in the following table.

Figure 18:
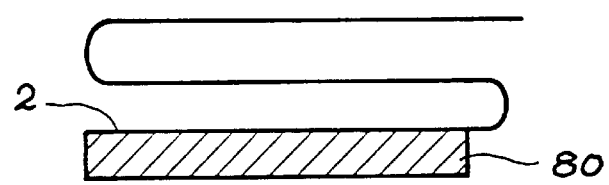
FIG. 18 shows a propagation line with a rectilinear portion and a curved or S-shaped portion.

For solutions II and III, the total length is greater than the length of a standard substrate. This is not important provided that the measurement line ($L_{working}$) can be put rectilinearly on the substrate: the portion of the line, of length b, is then disposed in "bends" as shown in FIG. 18. In this figure, the rectilinear portion is designated by reference 2. The sampling lines are situated in the zone 80.

Solutions II and III for analyzing long electrical signals make it possible to measure pulses of about 2 ns. Solution III offers an advantage over solution II in that its resolution is very high (220 points instead of 64 points), but such a resolution is not always necessary.

TABLE I

| SOLUTION | I | II | III |
| --- | --- | --- | --- |
| Pitch ($\mu$m) | 180 | 180 | 180 |
| $\Delta t$ (ps) simultaneous lighting) | 1.5 | 1.5 | 1.5 |
| Number of points | 64 | 64 | 120 |
| $\Delta T$ desired (ps) | 9 | 30 | 9 |
| $\Delta t$ (ps) | 9 − 1.5 = 7.5 | 30 − 1.5 = 28.5 | 9 − 1.5 = 7.5 |
| $\Delta l$ from one fiber to another (mm) | 7.5 ps × 0.2 mm/ps = 1.5 | 28.5 ps × 0.2 mm/ps = 5.7 | 7.5 ps × 0.2 mm/ps = 1.5 |

TABLE I-continued

| SOLUTION | I | II | III |
|---|---|---|---|
| Δl max (cm) | 0.15 cm × (64 − 1) = 9.45 | 0.57 cm × (64 − 1) = 35.91 | 0.15 cm × (220 − 1) = 32.85 |
| Max. dispersion (ps) | 9.45 × 1/50 ≈ 0.2 | 35.91 × 1/50 ≈ 0.72 | 32.85 × (220 − 1) ≈ 0.66 |
| Pitch/$V_{ceramic}$ ≠ Δt? | 180/118 = 1.5 ps ≠ Δt of 7.5 ps | 180/118 = 1.5 ps ≠ Δt of 28.5 ps | 180/118 = 1.5 ps ≠ Δt of 7.5 ps |
| $b_{max}$ annoyance (cm) | 2.22 | 10.026 | 7.75 |
| $B_{chosen}$ (cm) | 2.5 | 10.1 | 7.8 |
| $L_{working}$ (cm) | 64 × 0.0180 = 1.15 | 64 × 0.0180 = 1.15 | 220 × 0.0180 = 3.96 |
| $L_{total}$ (cm) | 2.5 + (64 × 0.0180) = 2.5 + 1.150 = 3.65 | 10.1 + (64 × 0.0180) = 10.1 + 1.150 = 11.25 | 7.8 + (220 × 0.0180) = 7.8 + 3.96 = 11.79 |
| Total length of the pulse | 63 × 9 = 567 ps | 63 × 30 = 1.89 ns | 219 × 9 = 1.971 ns |

The total length is greater than or equal to n × p + length of one tab

It can be noted that there is quite a large difference between the maximum fiber lengths of solutions II and III. This gives dispersion of about +0.7 ps for the pulse arriving last relative to the first generated pulse. This means that the sampling time is progressively increased.

A 64-point sampler having a pitch of 180 μm associated with different bundles of fibers thus makes it possible to provide a good solution. It makes it possible to obtain a pulse measurement that is not deformed very much and above all to obtain good flexibility as regards the sampling interval. It is possible to cause the sampling interval to vary from less than 9 ps to more than 30 ps and thus the width of the pulse that can be measured varies from less than 567 ps to more than 1.89 ns.

What is claimed is:

1. A device for analyzing a single electrical pulse, which device comprises an electrical circuit made up of a propagation line, including, in uniformly distributed manner, optoelectronic switches constituted by photoconductor tabs disposed along the propagation line at pitch p, each of them being connected to a corresponding analysis line, characterised in that it comprises an optical device making it possible to light the switches with a laser beam or with portions of a laser beam, so that two adjacent photoconductor tabs are lit successively and not simultaneously, the duration Δt of the time interval between the lighting by the laser beam of two adjacent tabs being such that:

$$\Delta t \neq \frac{p}{V_c}$$

where $V_c$ is the speed of the propagation of an electrical signal in the propagation line; and there being n photoconductor tabs disposed along the propagation line at a pitch p, a distance b separating the first tab of the line from the end of the line, the following relationship being satisfied for any tab N(2≦N≦n) and for any k, 1≦k≦N−1:

$$2b \neq k\Delta t V_c - p[k+2(n-N)]$$

where $V_c$ designates the speed of propagation of an electrical signal in a line and where Δt is the duration of the time interval between the lighting, by the laser beam, of two adjacent tabs.

2. The device according to claim 1, the optical device comprising reflective zones of a reflector, which zones are disposed so as to impart a uniform optical delay.

3. The device according to claim 1, the optical device comprising a bundle of optical fibers of lengths that vary from one fiber to another.

4. The device according to claim 3, the optical fibers being positioned in grooves in an etched substrate.

5. The device according to claim 4, focusing means being disposed at the outlets of the optical fibers.

6. The device according to claim 4, focusing means being disposed at the outlets of the optical fibers.

7. The device according to claim 6, the focusing means being positioned in a groove or in cavities etched in the substrate.

8. The device according to claim 6, the focusing means being beads.

9. The device according to claim 3, the optical fibers being held at one end in a holding tube and at the other end in a holding device.

10. The device according to claim 1, the optical device comprising an energy distributor made up of optical waveguides formed in a substrate.

11. The device according to claim 10, the optical waveguides being monomode waveguides made of potassium.

12. The device according to claim 1, the optical device comprising a stepped device imparting a delay from one beam portion to another.

13. The device according to claim 12, the steps being formed by plane surfaces sloping relative to the normal of the steps.

14. The device according to claim 1, the photoconductors being disposed along the propagation line at a pitch greater than the pitch $p_m$ defined by:

$$\frac{2(p_m - L)}{V_c} = t$$

where L is the width of an analysis line, $V_c$ is the speed of propagation of an electric signal in the propagation line, and t is the mean recombination time of the photoconductors.

15. The device according to claim 1, characterised in that it comprises a plane mirror parallel with the propagation line and the analysis lines.

* * * * *